(12) United States Patent
Deolalikar

(10) Patent No.: US 7,325,183 B2
(45) Date of Patent: Jan. 29, 2008

(54) ERROR CORRECTION CODE GENERATION METHOD AND APPARATUS

(75) Inventor: Vinay Deolalikar, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 421 days.

(21) Appl. No.: 10/896,217

(22) Filed: Jul. 21, 2004

(65) Prior Publication Data

US 2006/0020873 A1 Jan. 26, 2006

(51) Int. Cl.
*H03M 13/11* (2006.01)
(52) U.S. Cl. .................... 714/777; 714/752
(58) Field of Classification Search ........... 714/777; H03M 13/11
See application file for complete search history.

(56) References Cited

U.S. PATENT DOCUMENTS

RE23,601 E * 12/1952 Hamming et al. ......... 714/777
7,103,829 B2 * 9/2006 Van Dijk et al. ......... 714/777

OTHER PUBLICATIONS

Wojciechowski, J et al.; Spectra of graphs with circulant blocks and their applications; Circuits and Systems, 1994. ISCAS '94., 1994 IEEE International Symposium on Publication Date: May 30-Jun. 2, 1994 vol. 5, On pp. 161-164 vol. 5.*
Tanner, R. Michael; The Tetrahedral Golay Code; Forney Festschrift (anticipated), Cambridge,Mass., Mar. 2000 URL: www.cse.ucsc.edu/~tanner/tetrahedralGolay.pdf.*
Tanner, R. Michael; On Quasi-Cyclic Repeat-Accumulate Codes; URL: http://www.ldpc-codes.com/papers/QCRAAllerton.pdf.*

* cited by examiner

*Primary Examiner*—R. Stephen Dildine

(57) ABSTRACT

A method and apparatus for generating an error correction code used in communicating over a channel, includes generating a set of candidate circulant blocks corresponding to a parity check matrix and a Hamming code wherein the Hamming code is initially unable to detect a predetermined error pattern without ambiguity due to one or more redundancies and eliminating columns of the parity check matrix and related redundancies in the detection of a predetermined error pattern as used by the resulting Hamming code.

15 Claims, 6 Drawing Sheets

$$H_{\bar{c}} = \begin{bmatrix} \boxed{\begin{array}{c} Cc_1 \\ n_1 \times n_2 \end{array}} & \boxed{\begin{array}{c} Cc_2 \\ n_1 \times n_2 \end{array}} & \boxed{\begin{array}{c} Cc_3 \\ n_1 \times n_2 \end{array}} & \bullet\bullet\bullet & \boxed{\begin{array}{c} C_{c(r-1)} \\ n_1 \times n_2 \end{array}} & \boxed{\begin{array}{c} C_{cr} \\ n_1 \times n_2 \end{array}} \end{bmatrix}$$

$$H = \begin{bmatrix} \boxed{\begin{array}{c} Cc_1 \\ n_1 \times n_2 \end{array}} & \boxed{\begin{array}{c} Cc_3 \\ n_1 \times n_2 \end{array}} & \bullet\bullet\bullet & \boxed{\begin{array}{c} C_{c(r-1)} \\ n_1 \times n_2 \end{array}} & \boxed{\begin{array}{c} C_{cr} \\ n_1 \times n_2 \end{array}} \end{bmatrix}$$

*FIG. 3C*

ERROR CORRECTION CODE GENERATION METHOD AND APPARATUS

BACKGROUND

The present invention relates to error control coding or coding theory for digital communications. When digital data is transmitted across a channel or retrieved from storage there is a probability that one or more bits in the data will become corrupted and change in value due to noise over the communication channel or the storage. Depending on the device, it has been shown that proper encoding and decoding techniques can be used to counter these errors at any rate below the channel's or storage device's particular channel capacity. The channel capacity value is mathematically determined based on the bandwidth and signal-to-noise ratio of the particular link.

Coding theory in recent years has seen explosive growth as communications and storage has become a more integral part of business. Different types of coding schemes are used in compact disc players, cell phones, consumer and enterprise storage devices, the defense industry and other applications using digital technology. These technologies have driven researchers to develop encoding and decoding routines that best suit the particular device and best counteract any particular weaknesses in the communications or storage device.

Hamming codes are one type of coding scheme capable of detecting and helping correct errors occurring over various types of links. Conventional Hamming code designs are done in a brute force manner by exploring the many permutations that result when errors are introduced to communications occurring over a channel or on a storage device. In some cases, the type of error occurring on the channel is limited to a particular combination or class of errors. For example, a particular channel may be more likely to experience 3-bit adjacent errors than other types of errors due to the type of data transmitted over the channel or the nature of the channel device.

Despite the commercial value, conventional coding design methods continue to use brute force methods to design Hamming codes and other codes. These methods take into account specific qualities of the channel and consider the type of error likely to occur on the channel. Unfortunately, the conventional approach to designing a Hamming code are not efficient as it requires exploring any or all possible permutations rather than use an efficient heuristic or other more direct approach.

There is a need to address at least the aforementioned problems and develop Hamming codes with particular qualities in a more efficient manner.

BRIEF DESCRIPTION OF THE DRAWINGS

FIG. 3C is a schematic diagram illustrating the elimination process described in accordance with one implementation of the present invention.

Like reference numbers and designations in the various drawings indicate like elements.

SUMMARY OF THE INVENTION

A method and apparatus for generating an error correction code used in communicating over a channel, includes generating a set of candidate circulant blocks corresponding to a parity check matrix and a Hamming code wherein the Hamming code is initially unable to detect a predetermined error pattern without ambiguity due to one or more redundancies and eliminating columns of the parity check matrix and related redundancies in the detection of a predetermined error pattern by the resulting Hamming code.

DETAILED DESCRIPTION

Aspects of the present invention are advantageous in at least one or more of the following ways. Implementations of the present invention facilitate development of error correction codes using an efficient and well-defined methodology. Given a particular error pattern to be detected, implementations of the present invention rapidly generate a parity check matrix to detect an error pattern resulting from transmission over a noisy or imperfect communication channel. Computational efficiency in determining this parity check matrix facilitates rapid determination of the matrix using only modest computing resources. For a relatively simple error pattern, implementations of the present invention provide an elegant solution to otherwise brute-force searching methodologies currently used. At a much larger scale, implementations of the present invention facilitate detection of more complex error patterns using wireless or wired forms of communication.

Additionally, implementations of the present invention can be used to enhance and compliment existing approaches in error correction and coding theory. Existing error correction approaches using parity check matrices, Hamming codes and other similar constructions can implement aspects of the present invention without completely redesigning the existing communication systems and error control approaches. Instead, aspects of the present invention expedite the research and development of efficient Hamming codes designed to detect and/or correct certain expected error patterns that occur during transmission.

Figure 1:
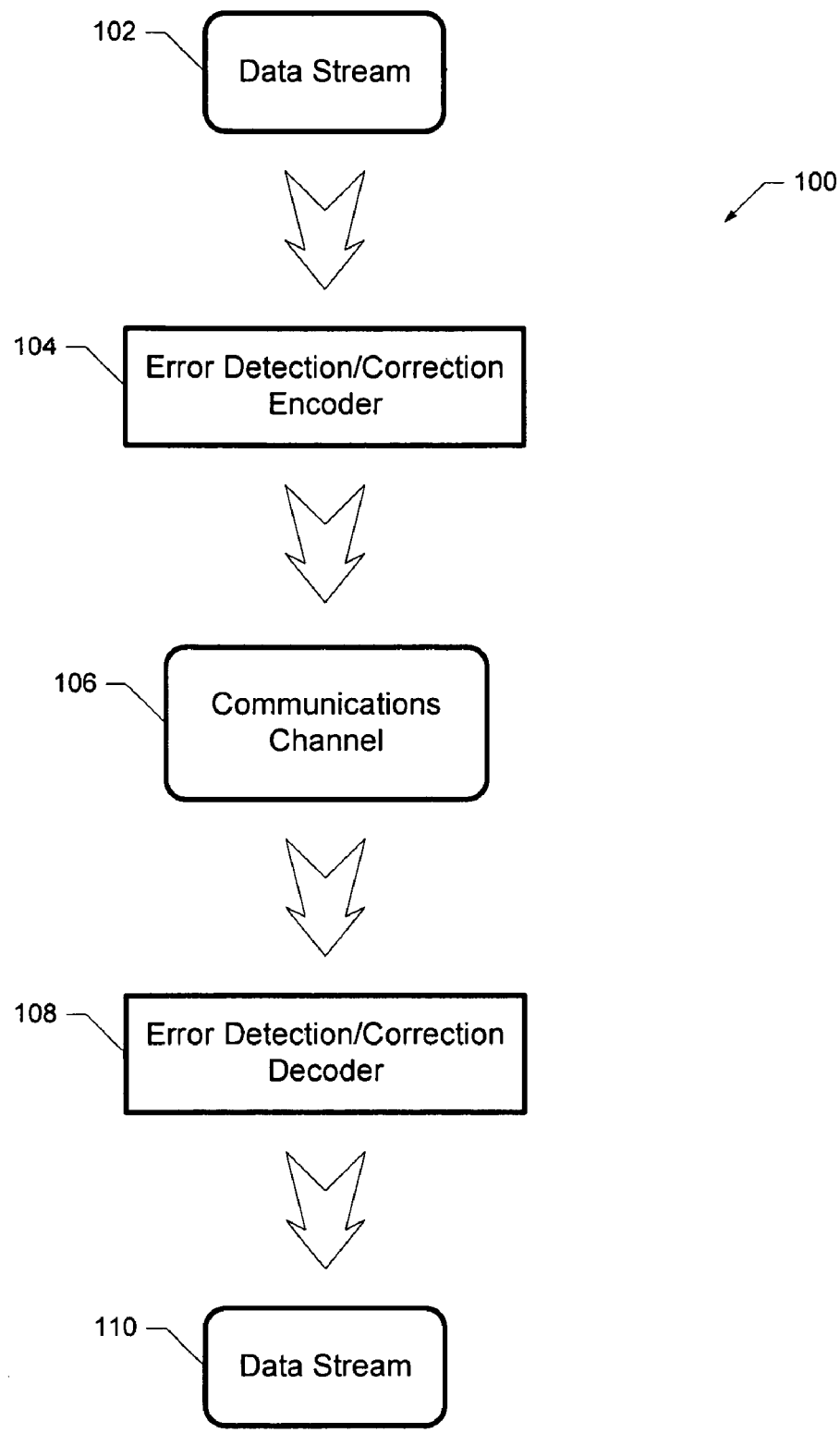
FIG. 1 is a flowchart diagram of a communication channel implementing error correction in accordance with one implementation of the present invention.

FIG. 1 is a flowchart diagram 100 of a communication channel implementing error correction in accordance with one implementation of the present invention. A message to be transmitted over the channel is initially contained in a data stream 102 as a binary or q-ary sequence of bits. Source coding is the operation of converting the message into a code suitable for transmission and general data processing.

The channel can be a wired or wireless connection and unfortunately may introduce errors into the message in data stream 102 by flipping bits in the binary or q-ary bit sequence. Additional data is added to the message by error detection/correction encoder 104 to ensure resiliency from these error events and preserve the original message. Channel coding takes the source coded message and further adds data to counteract introduction of errors in the message and communication failure. The added data provides sufficient redundancy in the message to accurately detect or, in some cases, correct errors introduced as the message passes through the channel. Hereinafter, the channel coded information is transmitted as one or more codewords.

Implementations of the present invention are used to identify this additional data to be added to data stream 102 and ensure adequate detection of the errors, if any, as the message and added data are transmitted. Various types of Error Control Coding describe different schemes for countering the effects of errors with different combinations of additional data. As will be described in further detail, implementations of the present invention readily identifies a parity check matrix that exploits known error patterns likely to occur on the given communications channel. For example, the present invention can be used to develop a Hamming code that detects 3-bit adjacent errors known to occur with some degree of frequency over a given channel.

As previously mentioned, communications channel 106 can be a wired or wireless connection between two points designed to carry data, voice or any other binary or q-ary encoded content. Messages passing over communications channel 106 may inherently become distorted due to imperfections in the equipment carrying the information or terrestrial occurrences that interfere with otherwise error-free communications occurring over normally operating communication equipment.

Error detection/correction decoder 108 processes codewords received at the destination end of the communications channel 106 and determines if a codeword has been corrupted and needs correction. For example, one implementation of the present invention is used to design a Hamming code that detects adjacent three-bit errors that occur while passing through communications channel 106. The Hamming code utilized in error detection/correction decoder 108 operates like other Hamming codes yet is designed and implemented in a more efficient manner in accordance with the present invention. In most instances, error detection/correction decoder detects the particular error in the transmission and requests a retransmission of the corrupted data. If it is possible, the error may be corrected using the error correction properties made available through the particular Hamming code and codeword transmitted. In either event, the retransmitted or corrected codeword is inserted along with other uncorrupted codewords into a data stream 110 to complete the intended communication.

Figure 2:
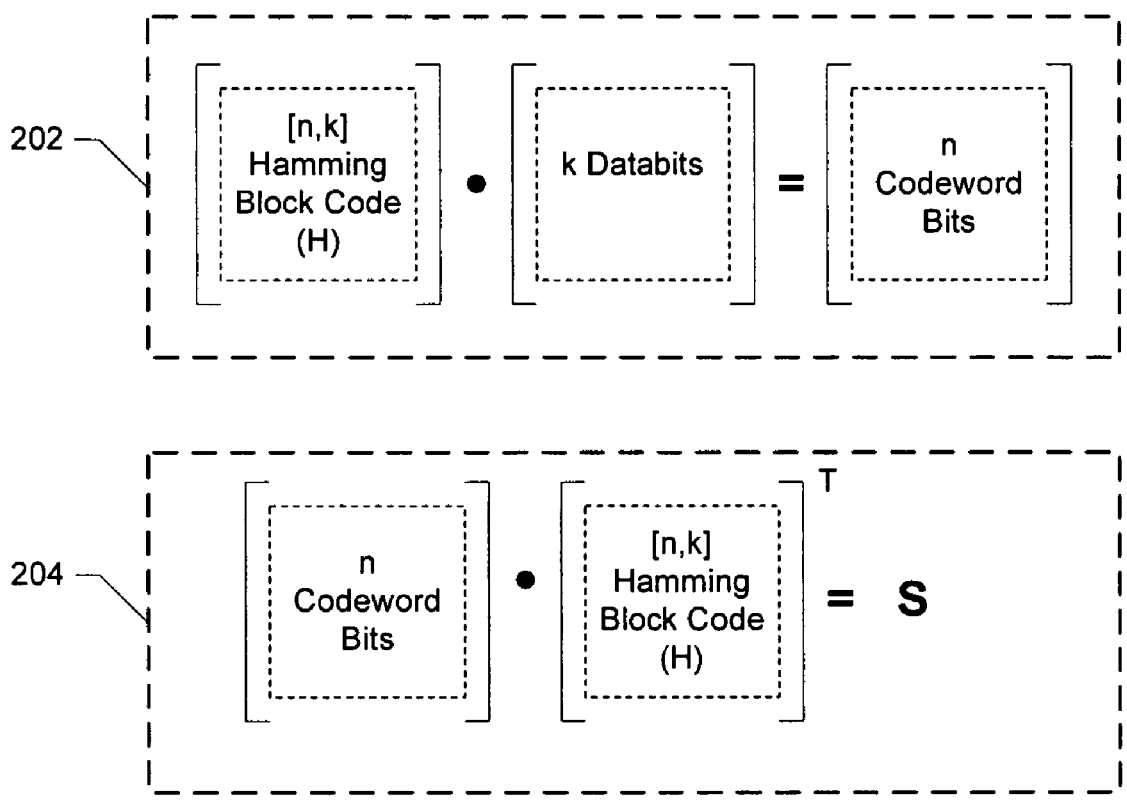
FIG. 2 is a block diagram illustration of Hamming codes and matrix operations that encode data streams into codewords and facilitate subsequent error correction using an Error Control Coding operation in accordance with implementations of the present invention.

FIG. 2 is a block diagram illustration of Hamming codes and matrix operations that encode data streams into codewords and facilitate subsequent error correction using an Error Control Coding operation. Encode transformation 202 in FIG. 2 demonstrates the matrix operation for adding a predetermined amount of redundancy to k databits resulting in a total of n codeword bits. The encoding scheme used with encode transformation 202 occurs prior to data transmission and counteracts errors introduced by way of the channel. In general, a coding scheme adding n-k additional bits of redundancy to every block of databits is identified as an [n,k] block code. Sufficient redundancy in the block code transmitted over the channel allows the decoder at the receiving end of the communications channel to either detect or both detect and correct any errors in the transmitted codewords.

The minimum distance or lowest Hamming weight associated with the block code is intimately related to the amount error detection or correction possible at the receiving end of the communications channel. The lowest Hamming weight is the minimum distance measured bit-wise between one or more codewords in the block code; a lower Hamming weight or smaller distance between codewords affords less error detection and correction capabilities as a small error may result in a valid codeword and go undetected. Conversely, a much larger Hamming weight distance increases the likelihood that one or more bit errors incurred during transmission could be detected and possibly corrected. The proper Hamming code design depends on the degree of error detection and correction desired and the minimum Hamming weight associated with the block code being used.

Accordingly, a given block code of codewords possesses at least two measurable types of error control capabilities: error correction and error detection. The block code is considered t-error correctable when any error of t bits or fewer can be corrected and restored at the receiving end of the communications channel to the original databits. For example, an [n,k] block code with a minimum Hamming code distance d can correct up to $$\frac{d-1}{2}$$

errors. Similarly, the [n,k] block code is considered l-error detecting when bit-errors of l or fewer bits can be detected at the receiving end of the communications channel. More importantly, the [n,k] block code's capability of simultaneously correcting t or fewer errors and detecting l or fewer errors is described by the following relationship:

$$d \geq t+l+1$$

Decode transformation 204 illustrates Hamming codes and matrix operations that decode data streams into codewords and facilitate detection and/or correction of errors introduced during transmission. The codewords transmitted are considered to be linear and the modulo-2 sum of any two codewords should also result in a codeword. To confirm the receipt of a valid codeword, decode transformation 204 multiplies the codeword bits received over the channel by the transpose of the Hamming code block. The resulting syndrome ("S") of decode transformation 204 indicates a valid n codeword bits when the dot product $v \cdot H^T = 0$ results in a zero value. Conversely, the syndrome "S" detects or indicates an error has been found when the dot-product results in a non-zero vector. Specifically, if there is an error than the non-zero syndrome computed from the modulo-2 sum of columns in the parity check or H matrix may indicate the bit positions in error.

It is interesting to note that conventional Hamming codes having a minimum distance d have the potential for detecting errors, albeit less accurately, outside the previously mentioned requirement that $d \geq t+l+1$ for an l-error detecting [n,k] block code. Beyond this limitation, conventional Hamming code decoders may detect additional errors but in a manner that is neither reliable or guaranteed. For example, it can be seen that an [n,k] Hamming code is capable of detecting $2^n - 2^k$ error patterns of length n. There are $2^n - 1$ non-zero error patterns of which a total of $2^k - 1$ coincide with valid codewords. If one of the $2^k - 1$ codewords is added with another codeword then the result will be another codeword and the decoder cannot detect the codeword resulting from an error as both codewords remain linear. Conversely, the remaining $2^n - 2^k$ codewords do not cause one codeword to be generated from another and their presence can be detected as one or both have been altered and are no longer valid codewords. Accordingly, conventional [n,k] block codes can correct up to $$\frac{2^n}{2^k} \text{ or } 2^{n-k}$$

total error patterns.

Conventional Hamming codes are particularly interesting and useful in a variety of communication and storage applications as they have single error correcting code capability. The Hamming codes with 1-bit error correction capability (t=1) also have a minimum Hamming distance of 3 between codes (d=3) and $2^m$ columns of nonzero m-tuples.

By shortening and modifying the Hamming code to include fewer columns additional interesting properties are also possible. By deleting 1 columns from the parity check matrix of the Hamming code increases the minimum distance to values potentially greater than 4 (d≧3) and correspondingly increases error correction capabilities to greater than only 1 bit of error correction (t≧1).

Modifying the Hamming code to include only the m-tuples having an odd Hamming weight has a different result on the coding properties. For example, using odd Hamming weight m-tuples results in codes of length $n=2^{m-1}$, data bits or a dimension of $k=2^{m-1}-m$ and a minimum distance increased to 4 (d=4). This modification of using odd Hamming weight m-tuples does not increase the error correction capabilities beyond 1-bit (t=1). As described in further detail later herein, one or more of the aforementioned modifications to Hamming codes can be used to effectuate a desired change in the operation of the Hamming code.

Figure 3A:
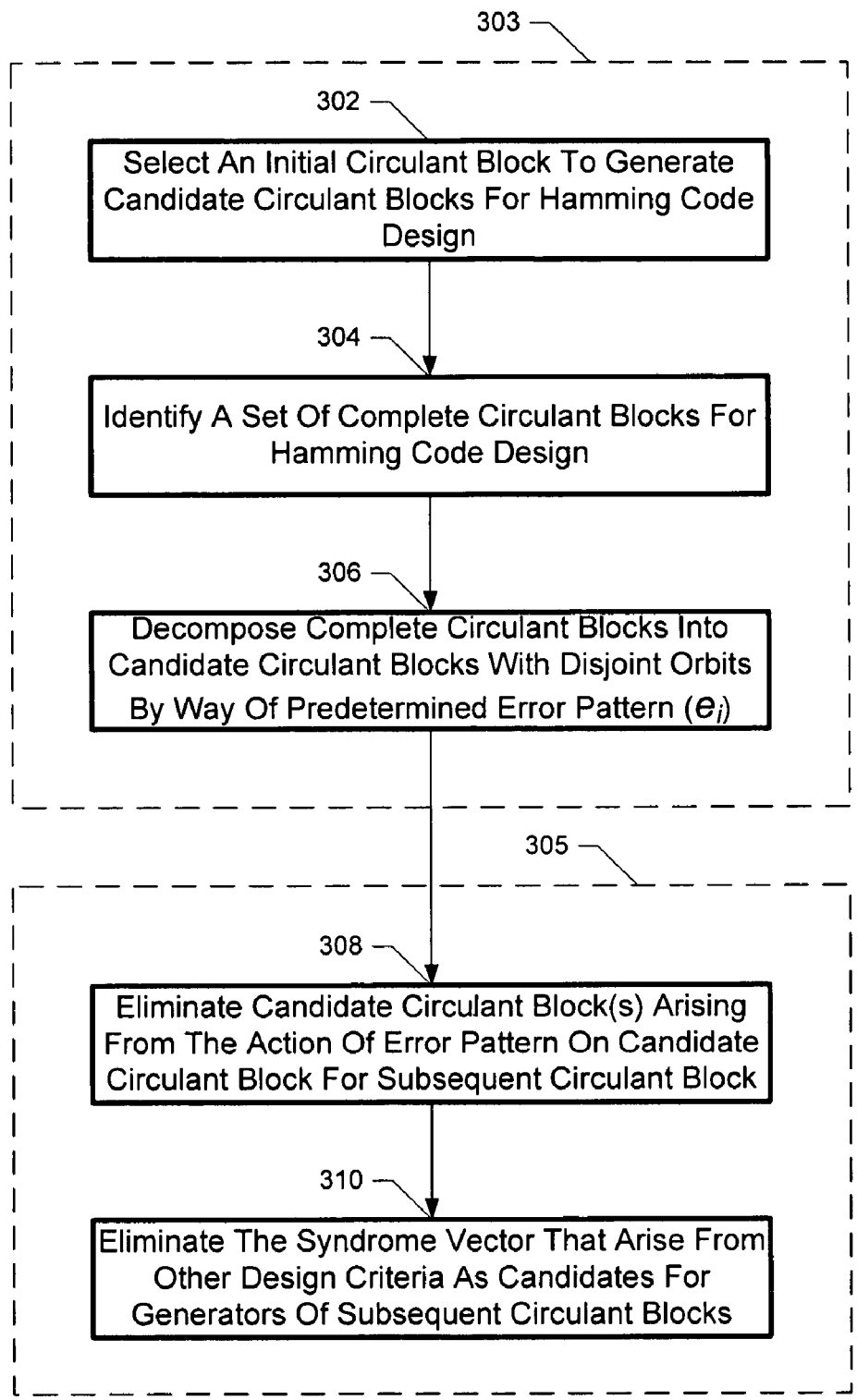
FIG. 3A is a flowchart diagram describing the operations for using circulant blocks to design a Hamming code capable of detecting a predetermined error pattern in accordance with implementations of the present invention.

In one implementation of the present invention, circulant blocks are used to guide the design of a Hamming code with certain desired properties. Implementations of the present invention modify the conventional Hamming codes in light of the aforementioned modifications to accurately detect a greater number of error patterns with reliability and certainty. FIG. 3A is a flowchart diagram describing the operations for using circulant blocks to design a Hamming code capable of detecting a predetermined error pattern. Of course while this example is described in detail, it is contemplated that the methodology employed in this example can be used to generate other Hamming codes capable of detecting other error patterns or even generate Hamming codes possessing other qualities other than the ability to detect only a particular predetermined error pattern.

A first portion of the present invention generates a set of candidate circulant blocks corresponding to a large parity check matrix and a Hamming code unable to detect a predetermined error pattern without ambiguity (303). As previously described, conventional Hamming codes having a minimum distance d have the potential for detecting errors, albeit less accurately, outside the previously mentioned requirement that d≧t+l+1 for an l-error detecting [n,k] block code. The initial Hamming code generated by the parity check matrix cannot reliably detect additional errors beyond this point. A second portion of the invention, eliminates columns of the parity check matrix the redundant detection of a predetermined error pattern in the generated resulting Hamming code (305). The columns eliminated in the parity check matrix allow the corresponding Hamming code to now unambiguously detect the predetermined error pattern. As previously described, deleting columns from the parity check matrix of the Hamming code increases the minimum distance to values potentially greater than 4 (d≧3) and correspondingly increases error correction capabilities to greater than only 1 bit of error correction (t≧1).

One implementation of the present invention generates the set of candidate circulant blocks and parity check matrix (303) using operations 302, 304, and 306. Initially, this particular implementation of the present invention selects an initial circulant block to generate candidate circulant blocks for the Hamming code design (302). The circulant block is a $n_1 \times n_2$ block of symbols having i columns and constructed by performing an upward cyclic shift of one position of the $(i-1)^{th}$ column to generate the $i^{th}$ column. Further, the circulant block of i columns is further constructed such that $2 \leq i \leq n_2$; if $n_1 = n_2$ then the circulant is further classified and described as being a complete circulant block.

Figure 3B:
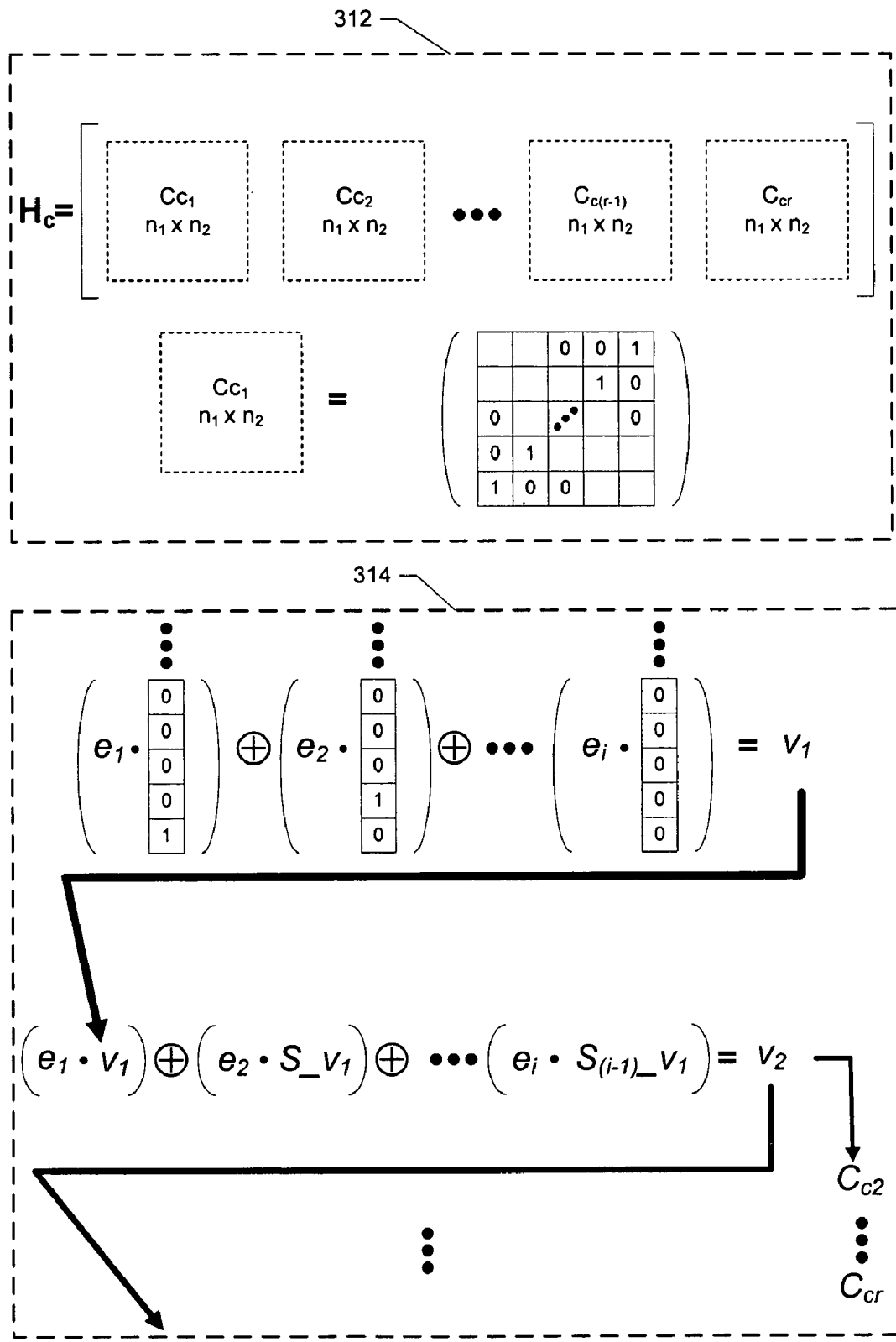
FIG. 3B illustrates a candidate circulant Hamming code ($H_c$) in accordance with one implementation of the present invention.

Candidate circulant Hamming code ($H_c$) 312 is illustrated in FIG. 3B in accordance with one implementation of the present invention. In this example, the initial candidate circulant Hamming code $C_{c1}$ is the $n_1$-k×$n_2$-k identity matrix and the remaining blocks $C_{c2}$ through $C_{cr}$ are chosen according to the properties desired for the Hamming code. Referring back to FIG. 3A, one implementation then identifies a set of complete circulant blocks for the Hamming code design (304). This operation involves arranging the set of all $2^{n-k}$ possible column vectors to form a total of $(2^{n-k}-2)/(n-k)$ complete circulants of size (n-k). Additionally, two blocks of size 1 (i.e., the all 0 and all 1 column vectors) are also included for subsequent consideration.

Next, implementations of the present invention decompose the set of complete circulant blocks into a set of candidate circulant blocks with disjoint orbits by way of predetermined error pattern ($e_i$) (306). FIG. 3B illustrates the operation of deriving an orbit through the action of an error pattern on one or more columns of a candidate circulant block. As previously described, this example uses the $n_1$-k× $n_2$-k identity matrix for the initial circulant Hamming code candidate $C_{c1}$. To derive the remaining circulant Hamming code candidates, a predetermined error pattern e=($e_1, \ldots, e_i$) is used on one or more column vectors. For example, an error pattern of three adjacent bits is represented by the pattern e=(1,1,1). In this example implementation, the error patterns are used in conjunction with cyclic shifted columns from a previous candidate circulant Hamming code. The candidate circulant Hamming code and mapping to the error pattern e=($e_1, \ldots, e_i$) is derived from the following formula:

$$me: v \rightarrow = e_1 v \oplus e_2 S_-(v) \oplus e_3 S_{-2} v \ldots, e_i S_{(i-1)_-}(v)$$

The outline of decomposition operation 314 is illustrated schematically in FIG. 3B. In the first instance of decomposition operation 314, a set of columns from the initial circulant Hamming code candidate $C_{c1}$ is crossed with the error patterns e=($e_1, \ldots, e_i$) to create a subsequently used vector $v_1$. Each element of the error pattern is multiplied by the associated column vector of the initial circulant Hamming code candidate $C_{c1}$ and combined using modulo-2 addition. Results of the modulo-2 addition of the columns are combined together and used as both a seed for generating other column vectors and the subsequent circulant Hamming code candidates $C_{cc2}$ through $C_{cr}$ as illustrated in the schematic. For example, vector $v_1$ is increasingly wrap-around downshifted in single shift increments based on the $i^{th}$ column value and as indicated by the notation: $S_{(i-1)_-}v_1$. The result is a entire orbit of the block under the mapping of me. Alternate implementations that upshift vector $v_i$ in a similar manner would instead use the notation: $S_{(i-1)_+}v_1$.

For instance, using an example error pattern of e=(1,1,1), the entire orbit of this block under the mapping uses the three downshifted vectors from the from the initial circulant Hamming code candidate namely:

$$v_1=(1,0,0,0,0,0,0,0)^T, S\_v_1=(0,1,0,0,0,0,0,0)^T, S_{-2}v_1=(0,0,1,0,0,0,0,)^T$$

Under the action of the error pattern in operation me this would result in vector $v_2$ and associated downshifted columns:

$$v_2=(1,1,1,0,0,0,0)^T, S\_v_2=(0,1,1,1,0,0,0,0)^T, S_{-2}v_2=(0,0,1,1,1,0,0,0)^T$$

Repeating these operations allows creation of the orbits for all blocks and their decomposition into disjoint orbits under the mapping me.

Operations 308 and 310 describe one implementation for selectively eliminating columns of the parity check matrix and allowing the Hamming to unambiguously detect the predetermined error pattern in accordance with the subsequent portion of the present invention (305). Referring to the flowchart in FIG. 3A, implementations of the present invention builds the parity check matrix by eliminating or skipping circulant block(s) arising from the action of the error pattern on circulant block candidates for subsequent circulant block (308). For example, the generator of the initial candidate circulant block $C_{c1}$ (i.e., the identity matrix) operated upon by the error pattern me identifies the circulant candidate block to be eliminated; the candidate circulant block subsequent becomes the actual circulant block $C_{c2}$ to be used in the resulting parity check matrix. In one example implementation, the generator identifier is the m-tuple in the right most column of the circulant block. The generator of the second candidate circulant block $C_{c2}$ is then acted upon by me and used to eliminate yet another subsequent block with a matching circulant. Eliminating the matching circulant candidate block is useful as it reduces the ambiguity inherent to conventional Hamming code when attempting to perform additional desired error control coding operations. FIG. 3C is a schematic diagram illustrating the elimination process described.

In the above example, resulting parity check matrix is a Hamming code having codewords of length $2^{n-k-2}$ capable of detecting all adjacent 3-bit errors occurring within one circulant block. Similar type errors occurring between two circulant blocks can also be detected through a search of the various permutations of circulant blocks over which 3-bit errors might occur. Eliminating these otherwise undetectable errors between circulant block boundaries is of relatively low computational complexity due to the circulant nature of the parity check matrix.

Circulants used in accordance with the present invention can also be used to detect errors occurring in a nibble detect context. As previously described, the identity circulant block is used as the initial candidate circulant block $C_{c1}$. In one implementation, the present invention forms all 3-bit nibble syndromes for the 3-bit adjacent error pattern in the initial candidate circulant block $C_{c1}$. The subsequent candidate circulant blocks generated by these syndromes are eliminated from consideration as before. Likewise, the remaining column vectors from the remaining candidate circulant blocks are used to generate candidate circulant block $C_{c2}$ and in a similar manner the remaining candidate circulant blocks $C_{c2}, \ldots, C_{cr}$.

This operations described previously can be performed in various more efficient ways. First, the operations can be performed in parallel for increased time efficiency. Second, a composite criteria can also be used to determine $C_{c2}, \ldots, C_{cr}$. For example, the sum of the two left most columns of $C_{c1}$ can be added to a column previously discarded because of nibble detect concerns. This latter operation is performed in consideration of the design criteria for detecting the 3-bit error pattern or other design criteria as needed. The resulting column from this operation is used to generate $C_{c2}$ and the process is repeated at the boundary of $C_{c2}$ and subsequently up to $C_{cr}$. The resulting code from this operation not only detects the error pattern intended (e.g., a 3-bit adjacent error) but also the 3-bit adjacent errors in a nibble detect context.

Figure 4:
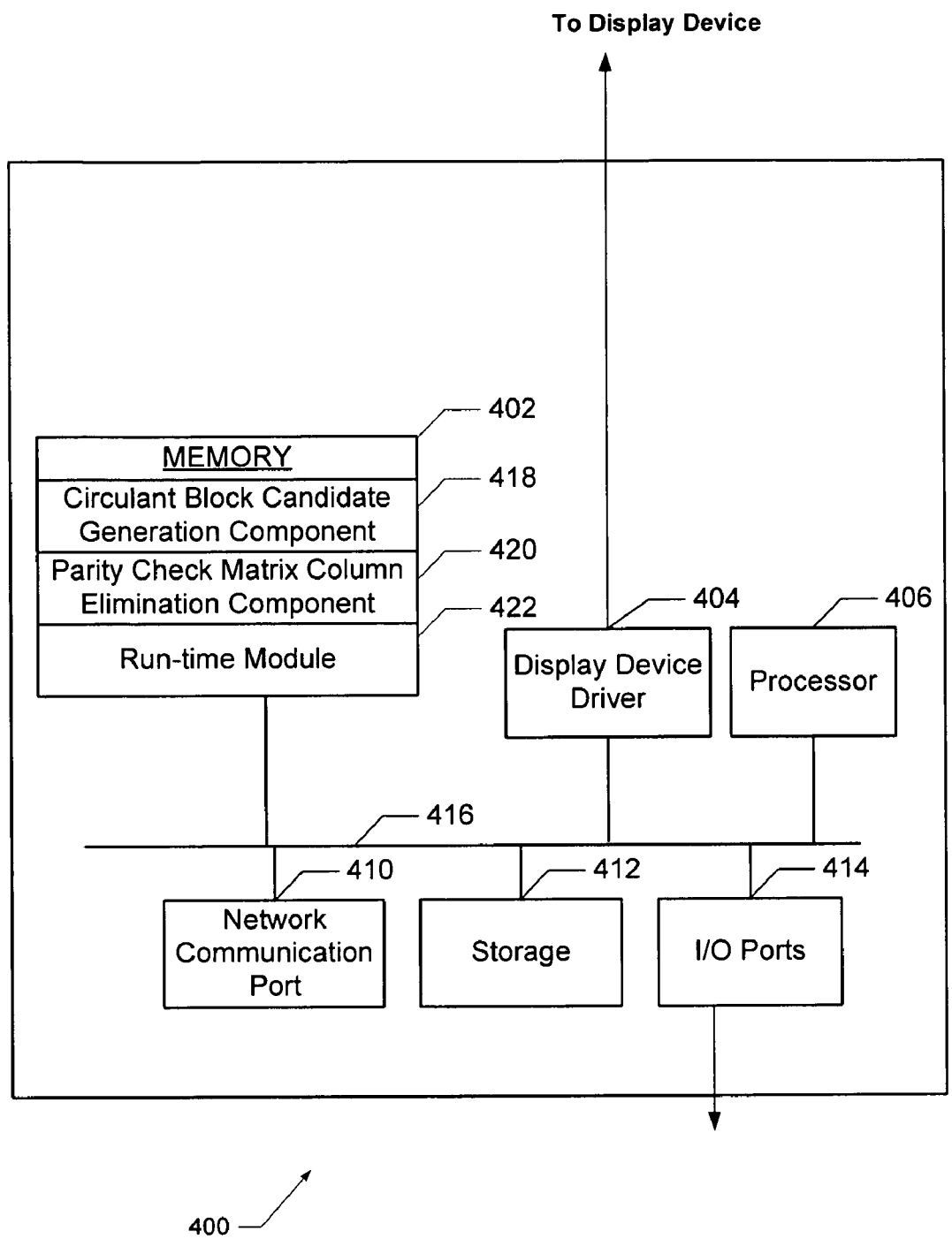
FIG. 4 is a schematic diagram of a system designed in accordance with one implementation of the present invention.

FIG. 4 is a schematic diagram of a system 400 designed in accordance with one implementation of the present invention. System 400 includes a memory 402 to hold executing programs (typically random access memory (RAM) or read-only memory (ROM) such as a flash RAM), a display device driver 404 capable of interfacing and driving a display or monitor device, a processor 406, a network communication port 410 for data communication, a storage 412, and input/output (I/O) ports 414 also with I/O controller operatively coupled together over an interconnect 416. System 400 can be preprogrammed, in ROM, for example, using field-programmable gate array (FPGA) technology or it can be programmed (and reprogrammed) by loading a program from another source (for example, from a floppy disk, a CD-ROM, or another computer). Also, system 400 can be implemented using customized application specific integrated circuits (ASICs).

In one implementation, memory 402 includes a circulant block candidate generation component 418, parity check matrix column elimination component 420, and run-time module 422 that manages the resources associated with system 400. In operation, circulant block candidate generation component 418 identifies a set of circulant blocks to generate an initial parity check matrix and Hamming code. As previously described, the Hamming code is capable of detecting certain predetermined error conditions without certainty and therefore cannot be relied upon. Implementations of the present invention then use parity check matrix column elimination component 420 to selectively eliminate columns inducing this ambiguity and uncertainty in the Hamming code. The resulting improved Hamming code is then capable of detecting certain predetermined error codes. For example, the Hamming code can be designed and implemented in accordance with the present invention to detect a 3-bit adjacent error in a communication signal.

While examples and implementations have been described, they should not serve to limit any aspect of the present invention. Accordingly, implementations of the invention can be implemented in digital electronic circuitry, or in computer hardware, firmware, software, or in combinations of them. Apparatus of the invention can be implemented in a computer program product tangibly embodied in a machine-readable storage device for execution by a programmable processor; and method steps of the invention can be performed by a programmable processor executing a program of instructions to perform functions of the invention by operating on input data and generating output. The invention can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language.

Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs.

Furthermore, while specific embodiments have been described herein for the purposes of illustration, various modifications may be made without departing from the spirit and scope of the invention. Accordingly, the invention is not limited to the above-described implementations, but instead is defined by the appended claims in light of their full scope of equivalents.

What is claimed is:

1. A computer readable storage medium having encoded thereon processor-executable instructions for causing a processor to perform a method for generating an error correction code used in communicating over a channel, the method comprising:
    generating a set of candidate circulant blocks corresponding to a parity check matrix and a Hamming code wherein the Hamming code is initially unable to detect a predetermined error pattern without ambiguity due to one or more redundancies; and eliminating columns of the parity check matrix and related redundancies in the detection of a predetermined error pattern as used by the resulting Hamming code.

2. The computer readable storage medium of claim 1 wherein the instructions that generate the set of candidate circulant blocks further comprise instructions that:
    select an initial circulant block to generate candidate circulant blocks for the Hamming code;
    identify a set of complete circulant blocks for the Hamming code design derived from the initial circulant block; and
    decompose the set of complete circulant blocks into candidate circulant blocks with disjoint orbits by way of the predetermined error pattern to be handled by the error correction code.

3. The computer readable storage medium of claim 1 wherein the instructions that eliminate the columns of the parity check matrix further include instructions that select from the set of candidate circulant blocks to eliminate a candidate circulant block arising from the action of the predetermined error pattern on the candidate circulant block for generators of subsequent circulant blocks.

4. The computer readable storage medium of claim 1 further comprising instructions that eliminate a syndrome vector that arises from other design criteria as candidates for generators of subsequent circulant blocks.

5. The computer readable storage medium of claim 4 wherein the other design criteria includes detecting errors in a nibble detect context.

6. The computer readable storage medium of claim 1 wherein the operations are performed in parallel for improved performance characteristics when generating the error correction code.

7. The computer readable storage medium of claim 1 wherein the predetermined error pattern is replaced by a composite design criteria including the predetermined error pattern combined with additional design criteria.

8. An apparatus for generating an error correction code used in communicating over a channel, comprising:
    means for generating a set of candidate circulant blocks corresponding to a parity check matrix and a Hamming code wherein the Hamming code is initially unable to detect a predetermined error pattern without ambiguity due to one or more redundancies; and
    means for eliminating columns of the parity check matrix and related redundancies in the detection of a predetermined error pattern as used by the resulting Hamming code.

9. An apparatus for generating an error correction code used in communicating over a channel, comprising: a processor capable of executing instructions; a memory containing instructions compatible with the processor when executed, cause the processor to generate a set of candidate circulant blocks corresponding to a parity check matrix and a Hamming code wherein the Hamming code is initially unable to detect a predetermined error pattern without ambiguity due to one or more redundancies and eliminate columns of the parity check matrix and related redundancies in the detection of a predetermined error pattern by the resulting Hamming code.

10. The apparatus of claim 9 wherein the instructions that generate the set of candidate circulant blocks further comprise instruction that: select an initial circulant block to generate candidate circulant blocks for the Hamming code, identify a set of complete circulant blocks for the Hamming code design derived from the initial circulant block and decomposing the set of complete circulant blocks into candidate circulant blocks with disjoint orbits by way of the predetermined error pattern to be handled by the error correction code.

11. The apparatus of claim 9 wherein the instructions that eliminate the columns of the parity check matrix further operate by selecting from the set of candidate circulant blocks to eliminate a candidate circulant block arising from the action of the predetermined error pattern on the candidate circulant block for generators of subsequent circulant blocks.

12. The apparatus of claim 9 further comprising instructions that eliminate additional columns from the parity check matrix that arise from other design criteria as candidates for generators of subsequent circulant blocks.

13. The apparatus of claim 12 wherein the other design criteria includes detecting errors in a nibble detect context.

14. The apparatus of claim 9 wherein the operations are performed by the instructions in parallel for improved performance characteristics when generating the error correction code.

15. The apparatus of claim 9 wherein the predetermined error pattern is replaced by a composite design criteria including the predetermined error pattern combined with additional design criteria.

* * * * *

UNITED STATES PATENT AND TRADEMARK OFFICE
CERTIFICATE OF CORRECTION

PATENT NO. : 7,325,183 B2
APPLICATION NO. : 10/896217
DATED : January 29, 2008
INVENTOR(S) : Vinay Deolalikar It is certified that error appears in the above-identified patent and that said Letters Patent is hereby corrected as shown below:

In column 6, line 46, delete "me" and insert -- $m_e$ --, therefor.

In column 6, line 63, delete "me" and insert -- $m_e$ --, therefor.

In column 7, lines 3-4, delete
"$v_1=(1,0,0,0,0,0,0,0)^T$, S $v_1=(0,1,0.0,0,0,0,0,0)^T$, S $_2v_1= (0,0,1,0,0,0,0,)^{T}$" and
insert -- $v_1 = (1,0,0,0,0,0,0,0)^T, S\_v_1 = (0,1,0,0,0,0,0,0)^T, S\_2 v_1 = (0,0,1,0,0,0,0,0)^T$ --

In column 7, line 6, delete "me" and insert -- $m_e$ --, therefor.

In column 7, line 9, after "$v_2=$" delete "$(1,1,1,0,0,0,0)^T$" and insert
-- $(1,1,1,0,0,0,0,0)^T$ --, therefor.

In column 7, line 14, delete "me" and insert -- $m_e$ --, therefor.

In column 7, line 26, delete "me" and insert -- $m_e$ --, therefor.

In column 7, line 33, delete "me" and insert -- $m_e$ --, therefor.

Signed and Sealed this

Fifth Day of August, 2008

JON W. DUDAS
*Director of the United States Patent and Trademark Office*